United States Patent [19]

Yoshida et al.

[11] Patent Number: 4,841,300
[45] Date of Patent: Jun. 20, 1989

[54] ERROR CORRECTION ENCODER/DECODER

[75] Inventors: Hideo Yoshida; Tohru Inoue; Atsuhiro Yamagishi, all of Kamakura; Yoshiaki Oda; Minoru Ozaki, both of Amagasaki; Toshihisa Nishijima, Kanagawa, all of Japan

[73] Assignee: Mitsubishi Denki K.K., Tokyo, Japan

[21] Appl. No.: 63,178

[22] Filed: Jun. 17, 1987

[30] Foreign Application Priority Data

Jun. 18, 1986 [JP] Japan .............................. 61-141679
Jul. 17, 1986 [JP] Japan .............................. 61-168402
Oct. 8, 1986 [JP] Japan .............................. 61-240685

[51] Int. Cl.$^4$ .......................................... H03M 13/00
[52] U.S. Cl. ........................................ 341/94; 341/51; 371/37; 371/38; 371/47
[58] Field of Search ............... 340/347 DD, 347 DA; 371/37–40, 47, 48, 49, 65; 341/51, 52, 68, 71, 94; 375/111, 116

[56] References Cited

U.S. PATENT DOCUMENTS

| 4,142,174 | 2/1979 | Chen et al. | 340/146 |
|---|---|---|---|
| 4,162,480 | 7/1979 | Berlekamp | 340/146 |
| 4,389,636 | 6/1983 | Riddle et al. | 341/94 |
| 4,567,594 | 1/1986 | Deodhar | 371/38 |
| 4,580,162 | 4/1986 | Mori | 341/51 |
| 4,605,921 | 8/1986 | Riddle et al. | 371/49 |
| 4,649,541 | 3/1987 | Lahmeyer | 371/37 |

Primary Examiner—William M. Shoop, Jr.
Assistant Examiner—Brian Young
Attorney, Agent, or Firm—Takeuchi Patent Office

[57] ABSTRACT

A separate operational section for determining the degree of a polynomial is provided to increase the process speed in determining both error locator and evaluator polynomials. When a received word is decoded based on the error location found, the received word is stored in a memory and corrected and output through the designation of the address. The formula $$\sum_{j=0}^{t} \sigma_j a^{i(t-1)}$$

is derived from the error locator equation $$\sigma(z) = \sum_{j=0}^{t} \sigma_j z^j,$$

and the value of which satisfies $\sigma(\alpha)=0$ is determined to increase the process speed. The decoder and the encoder share part of the hardware to make the system compact.

9 Claims, 16 Drawing Sheets

ERROR CORRECTION ENCODER/DECODER

BACKGROUND OF THE INVENTION

1. [Field of the Invention]

The present invention relates to an encoder and decoder for correcting an error in Reed-Solomon (RS) codes.

2. [Description of the Prior Art]

There is known a decoder using a Euclid's decoding method for decoding the RS, BCH, or Goppa codes. The Euclid's decoding method was discovered by Sugiyama et al in 1974 (Sugiyama, Kasahara, Hirasawa, and Suberikawa, "Discussion of the Goppa Code," *Electronic Communications Society Technical Study Report*, PRL 73-77, pp 11-20 (1974)). The Goppa code is a broad class of new linear codes defined by a remarkable technique for projecting code vectors to rational equations including a subclass of the BCH code. Of course, it is applicable to the RS code. This Euclid's decoding method is easier to solve than Peterson' algorithm and is much easier to understand than Berlekamp's algorithm.

The decoding of an RS code consists of the following four steps:

(1) Finding the syndrome.

(2) Finding an error locator polynomial and an error evaluator polynomial from the syndrome.

(3) Determining an error location from the error locator polynomial using Chien's algorithm.

(4) Determining an error value from the error evaluator polynomial.

Euclid's algorithm is used in the above step 2. In the Euclid's decoding method of Goppa codes, the syndrome polynomial is defined by $$S(z) = -\sum_{i=1}^{n} r_i \frac{G(z) - G(\alpha_i)}{Z - \alpha_i} G^{-1}(\alpha_i) \quad (1)$$

where $\alpha_i$ is an element of $GF(q)$ which is different for $i$ and $G(z)$ is a Goppa polynomial that satisfies $$\sum_{i=1}^{n} \frac{a_i}{Z - \alpha_i} = 0 \pmod{G(z)} \quad (2)$$

where $a_i$ is an element of $GF(q)$. For RS codes, $$G(z) = Z^{2t}$$

where $t$ is the number of correctable errors and is related to the minimum distance $d$ as follows $$t = [(d-1)/2]$$

The Gaussian symbol $[x]$ represents the maximum integer no greater than $x$. For RS codes, Eq. 1 becomes $$S(z) = -\sum_{i=1}^{n} r_i \frac{Z^{2t} - \alpha_i^{2t}}{Z - \alpha_i} \alpha_i^{-2t} \quad (3)$$

Let us find a syndrome $S_j$ ($j=0, 1, \ldots 2t-1$) from the received vector. If the received vector $r(X) = r1 + r2X + \ldots + rnX^{n-1}$, the error vector $e(X) = e1 + e2X + \ldots enX^{n-1}$, and the roots of a generation polynomial $g(X) = \alpha^\gamma, \alpha^{\gamma+1}, \ldots \alpha^{\gamma+i-2}$, then $$\begin{aligned} S_j &= r(\alpha^{j\gamma}) \\ &= \sum_{i=1}^{n} r_i \alpha^{(j\gamma)(i-1)} \quad (4) \\ &= \sum_{i=1}^{n} e_i \alpha^{(j\gamma)(i-1)} \quad (5) \end{aligned}$$

Let us now consider the relation between $S_j$ and $S(z)$. If $\gamma = 1$, then $S(z)$ is given by $$S_j = r(\alpha^{j+1}) = \sum_{i=1}^{n} r_i \alpha^{(j+1)(i-1)} \quad (6)$$

On the other hand, Eq. 3 can be transformed as follows $$\begin{aligned} S(z) &= -\sum_{i=1}^{n} r_i \frac{Z^{2t} - \alpha_i^{2t}}{Z - \alpha_i} \alpha_i^{-2t} \\ &= -\sum_{i=1}^{n} r_i \sum_{j=0}^{2t-1} \alpha_i^{(j-2t)} Z^{(2t-1-j)} \\ &= -\sum_{j=0}^{2t-1} \sum_{i=1}^{n} r_i \alpha_i^{(j-2t)} Z^{(2t-1-j)} \end{aligned} \quad (7)$$

By converting $(2t-1-j)$ to $j$ in Eq. 7, we obtain $$S(z) = -\sum_{j=0}^{n} \sum_{i=1}^{n} r_i \alpha_i^{-(j+1)} Z^j \quad (8)$$

By comparing Eqs. 6 and 8, we obtain $$\alpha_i^{-(j+1)} = \alpha^{(j+1)(i-1)} \quad (9)$$

Hence, $S(z)$ can be given by $S_j$.

$$\alpha_i^{-1} = \alpha^{i-1} \quad (10)$$

From the above relationship, Eq. 3 is given by $$S(z) = -\sum_{j=0}^{2t-1} S_j Z^j \quad (11)$$

Next, Eq. 3 is transformed as follows $$S(z) = - \sum_{i=1}^{n} r_i \frac{Z^{2t} - \alpha_i^{2t}}{Z - \alpha_i} \alpha_i^{-2t} \qquad (12)$$

$$= - \sum_{i=1}^{n} e_i \frac{Z^{2t} - \alpha_i^{2t}}{Z - \alpha_i} \alpha_i^{-2t}$$

$$= - \sum_{i=1}^{n} \frac{e_i \{Z^{2t} - \alpha_i^{2t}\} \alpha_i^{-2t}}{\prod_{i=1}^{n} (Z - \alpha_i)} \prod_{\substack{j=1 \\ j \neq i}}^{n} (Z - \alpha_j)$$

$$= - \sum_{i=1}^{n} e_i \alpha_i^{-2t} \left\{ \frac{\prod_{j=1, j \neq i}^{n}(Z - \alpha_j) Z^{2t} - \alpha_i^{2t} \prod_{j=1, j \neq i}^{n}(Z - \alpha_j)}{\prod_{i=1}^{n}(Z - \alpha_i)} \right\}$$

$$= \frac{- \sum_{i=1}^{n} e_i \alpha_i^{-2t} \prod_{j=1, j \neq i}^{n}(Z - \alpha_j) Z^{2t} - \sum_{i=1}^{n} e_i \prod_{j=1, j \neq i}^{n}(Z - \alpha_j)}{\prod_{i=1}^{n}(Z - \alpha_i)} \qquad (13)$$

Let E be a set of error locations (i is a member thereof and $e_i \neq 0$), and $$\sigma(z) = \prod_{i \in E} (Z - \alpha_i) \qquad (14)$$

$$(15)$$

$$\eta(z) = \sum_{i \in E} e_i \prod_{\substack{j \in E \\ j \neq i}} (Z - \alpha_j) \qquad (16)$$

$$\phi(z) = \sum_{i \in E} e_i \alpha_i^{-2t} \prod_{\substack{j \in E \\ j \neq i}} (Z - \alpha_j)$$

then, Eq. 13 becomes $$S(z) = - \frac{\phi(z) Z^{2t} - \eta(z)}{\sigma(z)} \qquad (17)$$

$$\sigma(z) S(z) + \phi(z) Z^{2t} = \eta(z)$$

Eq. 17 is called key equation and cannot generally be solved. However, when the number of errors e is less than t, each error pattern has one different syndrome polynomial so that $\eta(z)$ and $\sigma(z)$ can unequivocally be determined from S(z).

FIG. 13 shows a flowchart for determining a solution of the key equation using Euclid's algorithm. The symbol [·] means a quotient of division. From Eq. 14, the error locator polynomial $\sigma(z)$ is $$\sigma(z) = \prod_{i \in E}(Z - \alpha_i) \qquad (18)$$

By substituting locations $\alpha_1$ to $\alpha_n$ in $\tau(z)$, we obtain an error location $\alpha_i$ given by $$\sigma(\alpha_i) = 0 \qquad (19)$$

This method is called Chien's algorithm. The error value $e_i$ at the error loaction i will be determined from the error locator polynomial $\sigma(z)$ obtained from Euclid's algorithm, the error evaluator polynomial $\eta(z)$, and the error location i obtained from Chien's algorithm. From Eqs. 14 and 15, $$\alpha(z) = \prod_{i \in E}(Z - \alpha_i) \qquad (20)$$

$$\eta(z) = \sum_{i \in E} e_i \prod_{\substack{i \in E \\ j \neq i}} (Z - \alpha_j) \qquad (21)$$

By performing formal differentiation for Eq. 20, we obtain $$\sigma'(Z) = \sum_{i \in E} \prod_{\substack{i \in E \\ j \neq i}} (Z - \alpha_j) \qquad (22)$$

By substituting the error location $\alpha_i$ for z in Eq. 22, we obtain $$\sigma'(\alpha_i) = \prod_{\substack{i \in E \\ j \neq i}} (\alpha_i - \alpha_j) \qquad (23)$$

Similarly to Eq. 22, by substituting $\alpha_i$ in Eq. 23, we obtain $$\eta(\alpha_i) = e_i \prod_{\substack{i \in E \\ j \neq i}} (\alpha_i - \alpha_j) \qquad (24)$$

From Eqs. 23 and 24, the error value is determined by $$e_i = \eta(\alpha_i)/\sigma(\alpha_i).$$

If the error is a single error, the error value is given by $$e_i = \eta(z) \text{ and deg. } \eta(z) = 0. \qquad (26)$$

For example, let us decode a RS code (15, 7, 9) on $GF(2^8)$ using the Euclid decoding method. Let the primitive polynomial p(X) and the generator polynomial g(X) be:

$$p(X) = X^8 + X^4 + X^3 + X^2 + 1 \tag{27}$$

$$g(X) = \prod_{i=1}^{8} (X - \alpha^i) \tag{28}$$

and the transmitted vector v and the received vector r be
v=(0, 0, 0, 0, 0, 0, 0, 0, 0, 0, 0, 0, 0, 0, 0)
r=(0, 0, $\alpha^{79}$, $\alpha^{88}$, $\alpha^{175}$, $\alpha^3$, 0, 0, 0, 0, 0, 0, 0, 0, 0).

The syndromes S0 to S7 for the received vector are given by $$S0 = \alpha^{81} + \alpha^{91} + \alpha^{179} + \alpha^8 = \alpha^{224} \tag{29}$$

$$S1 = \alpha^{83} + \alpha^{94} + \alpha^{183} + \alpha^{13} = \alpha^{74} \tag{30}$$

$$S2 = \alpha^{85} + \alpha^{97} + \alpha^{187} + \alpha^{18} = \alpha^{103} \tag{31}$$

$$S3 = \alpha^{87} + \alpha^{100} + \alpha^{191} + \alpha^{23} = \alpha^{160} \tag{32}$$

$$S4 = \alpha^{89} + \alpha^{103} + \alpha^{195} + \alpha^{28} = \alpha^{141} \tag{33}$$

$$S5 = \alpha^{91} + \alpha^{106} + \alpha^{199} + \alpha^{33} = \alpha^{65} \tag{34}$$

$$S6 = \alpha^{93} + \alpha^{109} + \alpha^{203} + \alpha^{38} = \alpha^{87} \tag{35}$$

$$S7 = \alpha^{95} + \alpha^{112} + \alpha^{207} + \alpha^{43} = \alpha^{211} \tag{36}$$

The syndrome polynomial S(z) is given by $$S(z) = \alpha^{224} + \alpha^{74}z + \alpha^{103}z^2 + \alpha^{160}z^3 + \alpha^{141}z^4 + \alpha^{65}z^5 + \alpha^{87}z^6 + \alpha^{211}z^7 \tag{37}$$

Since the number of correctable errors t is 4, the Goppa polynomial G(z) is given by $$G(z) = Z^8 \tag{38}$$

The error locator polynimial $\sigma(z)$ and the error evaluator polynomial $\eta(z)$ will be determined using the flow-chart of FIG. 13. The initial values are set as follows:
M1←$Z^8$
M2(z)←S(z)
U1(z)←0
U2(z)←0
U1'(z)←$\alpha^0$ Step 1:

$$Q(z) = \alpha^{44}z + \alpha^{175}$$

$$R(z) = \alpha^{228}z^6 + \alpha^{248}z^5 + \alpha^{211}z^4 + \alpha^{41}z^3 + \alpha^{199}z^2 + \alpha^{86}z + \alpha^{144}$$

$$U1(z) = \alpha^{44}z + \alpha^{175}$$

$$U2(z) = \alpha^0$$

deg $R(z) = 6 > t - 1 = 3$

The preparation for the next step (hereinafter, the same will be applied) is as follows
M1(z)←M2(z)
M2(z)←R(z)
U1'(z)←U1(z)

Step 2:

$$Q(z) = \alpha^{238}z + \alpha^{249}$$

$$R(z) = \alpha^{77}z^5 + \alpha^{228}z^4 + \alpha^{28}z^3 + \alpha^{85}z^2 + \alpha^{132}z + \alpha^{125}$$

$$U1(z) = \alpha^{27}z^2 + \alpha^{47}z + \alpha^{156}$$

$$U2(z) = \alpha^{44}z + \alpha^{175}$$

deg $R(z) = 5 < t - 1$

Step 3:

$$Q(z) = \alpha^{151}z + \alpha^{227}$$

$$R(z) = \alpha^{169}z^4 + \alpha^{239}z^3 + \alpha^{131}z^2 + \alpha^{23}z + \alpha^{198}$$

$$U1(z) = \alpha^{178}z^3 + \alpha^{74}z^2 + \alpha^{55}z + \alpha^{229}$$

$$U2(z) = \alpha^{27}z^2 + \alpha^{47}z + \alpha^{156}$$

deg $R(z) = 4 > t - 1$

Step 4:

$$Q(z) = \alpha^{163}z + \alpha^{138}$$

$$R(z) = \alpha^{45}z^3 + \alpha^{216}z^2 + \alpha^{56}z + \alpha^{41}$$

$$U1(z) = \alpha^{86}z^4 + \alpha^{156}z^3 + \alpha^{70}z^2 + \alpha^{149}z + \alpha^{72}$$

$$U2(z) = \alpha^{178}z^3 + \alpha^{74}z^2 + \alpha^{55}z + \alpha^{229}$$

deg $R(z) = 3 > t - 1$

At this point, Euclid's algorithm stops operation and the error locator polynomial $\sigma(z)$ and the error evaluator polynomial $\eta(z)$ are given by $$\begin{aligned}\sigma(z) &= (\alpha^{86}z^4 + \alpha^{156}z^3 + \alpha^{70}z^2 + \alpha^{149}z + \alpha^{72})/\alpha^{86} \\ &= z^4 + \alpha^{70}z^3 + \alpha^{239}z^2 + \alpha^{63}z + \alpha^{241}\end{aligned} \tag{39}$$

$$\begin{aligned}\eta(z) &= (\alpha^{45}z^3 + \alpha^{216}z^2 + \alpha^{56}z + \alpha^{41})/\alpha^{36} \\ &= \alpha^{214}z^3 + \alpha^{130}z^2 + \alpha^{255}z + \alpha^{210}\end{aligned} \tag{40}$$

The error location and value will be determined from the polynomials. The common technique for determining an error location is Chien's algorithm. When the following values, $a_3 \rightarrow \alpha^{253}$, $a_4 \rightarrow \alpha^{252}$, $a_5 \rightarrow \alpha^{251}$, $a_6 \rightarrow \alpha^{250}$, are substituted in Eq. 18, $\sigma(z) = 0$, indicating that $\alpha^{253}$, $\alpha^{252}$, $\alpha^{251}$, and $\alpha^{250}$ are roots of $\sigma(z)$ and that the error locations are 3, 4, 5, and 6. Thus, $\sigma(z)$ becomes $$\sigma(z) = (z - \alpha^{253})(z - \alpha^{252})(z - \alpha^{251})(z - \alpha^{250}).$$

The error values will be determined from the polynomials. The formal differentiation of $\sigma(z)$ is given by $$\begin{aligned}\sigma'(z) &= (z - \alpha^{253})(z - \alpha^{252})(z - \alpha^{251}) + \\ &\quad (z - \alpha^{253})(z - \alpha^{252})(z - \alpha^{250}) + \\ &\quad (z - \alpha^{253})(z - \alpha^{251})(z - \alpha^{250}) + \\ &\quad (z - \alpha^{252})(z - \alpha^{251})(z - \alpha^{250}).\end{aligned}$$

The error values e3, e4, e5, and e6 for the respective error locations are determined from the polynomials $\sigma(z)$ and $\eta(z)$.

$$e3 = \eta(\alpha^{253})/\sigma'(\alpha^{253})$$
$$= \alpha^{79}.$$
$$e4 = \eta(\alpha^{252})/\sigma'(\alpha^{252})$$
$$= \alpha^{88}.$$
$$e5 = \eta(\alpha^{251})/\sigma'(\alpha^{251})$$
$$= \alpha^{175}.$$
$$e6 = \eta(\alpha^{250})/\sigma'(\alpha^{250})$$
$$= \alpha^3.$$

FIG. 14 shows, in block form, a conventional decoder consisting of a multi-stage shift register 109 for delaying the received coded word, an adder 110, a syndrome computation circuit 111, an error locator polynomial deriving circuit 112, a Chien search circuit 113, a synchronizing circuit 114, a sequence control circuit 115, an input terminal 116 for receiving coded words, and an output terminal 117 for sending the corrected information.

In operation, when a coded word is put into the synchronizing circuit 114 through the input terminal 116, the synchronizing circuit detects the head of the received coded word. In response to the detected result, the sequence control circuit 115 starts operation. The received coded word is also put into the syndrome computation circuit 111 and the multi-stage shift register 109. The computed syndrome from the circuit 111 is fed to the error locator polynomial deriving circuit 112 to provide an error locator polynomial, which is then fed to the Chien search circuit 113 for performing Chien search.

As FIG. 15 shows, in the Chien search circuit, the coefficient of each term of the error locator polynomial $$\sigma(x) = \sigma 0 + \sigma 1 x + \sigma 2 x^2 + \ldots + \sigma t - 1 x^{t-1}$$

is set in an n-bit register K, to which clock pulses are input. When a certain number of clock pulses are input, the output at the terminal 302 becomes zero. Let the number of clock pulses input is i, then $\alpha i^c$ is a root of $\sigma(x)$. This process is called Chien search. At the same time, the received coded word is output from the multi-stage shift register 203 in sequence from the head. This output is synchronized with the Chien search operation performed in the circuit 113. When it is found to be a root of the error locator polynomial $\sigma(x)$ in the Chien search, the output of the multi-stage shift register 203 is corrected in the correction circuit 206.

FIG. 16 shows a conventional composite circuit having both syndrome and Chien search circuits. In this composite circuit, a syndrome is processed as follows. A succession of 8-bit words received at the input terminal 301 are fed through a switch Sx and the adders A0, A1, ... A15 in a Galois field $GF(2^8)$ to an array of 8-bit registers L0, L1, ... L15, which have been cleared, for latching. The latched contents of the registers L1, L2, ..., L15 are multiplied by constants $\alpha, \alpha^2, \ldots, \alpha^{15}$ in the Galois field $GF(2^8)$ in the multipliers B1, B2, ... B15 and fed to the adders A1, A2 ... A15 for calculating the sums with the next input at the terminal 301. The sums are latched in the registers L1, L2, ... L15. The content in the register L1 is added to the next input without multiplication in the adder A0 and the sum is latched in the register L0. When all of the received words have been input, the switches Sw0, Sw1, ... Sw15 are turned to the contacts U so that the calculated syndromes are shifted through the registers L0, L1, ... L15 in sequence and output at the terminal 303.

The Chien search is performed as follows. The contents of the registers L0, L1, ... L8 are fed to a summing circuit 304 for providing the sum of the Chien algorithm $$\sum_{j=0}^{8} \sigma_j (\alpha^j)^i$$

at the output terminal 302.

The above conventional decoder has the following shortcomings.

First, since the algorithm for finding error locator and evaluator polynomials completely depends on the program, the process takes much time.

Second, since the received word latched in the multi-stage shift register is corrected on the basis of the error location found in the Chien search circuit, the error locator polynomial deriving circuit becomes complicated for the long coded word, requiring a large number of stages of the multi-stage shift register.

Third, when the code is shortened for process, for example, the locations 148 through 258 are assumed to be 0 and errors up to the location 148 are to be detected for correction, the conventional system will perform calculation for $\alpha^{-254}, \alpha^{-253}, \ldots, \alpha^{-148}$ that are assumed to be 0 and do not actually exist due to the shortened process, thus wasting computing time. If the multiplying circuit is replaced by a dividing circuit and the initial value i=254 is used for computation, the delay time is sufficiently short to eliminate the above shortcoming. However, the dividing circuit is generally more complicated and takes more time in computation than the multiplying circuit.

Fourth, with an encoder which frequently is disposed with the decoder, even the composite circuit having both syndrome and Chien search circuits yet remains to be improved in size.

SUMMARY OF THE INVENTION

It is an object of the invention to provide a high-speed decoder requiring a smaller number of steps in the algorithm for finding error locator and evaluator polynomials.

It is another object of the invention to provide a decoder using no multi-stage shift register so as to ease the handling of a long coded word.

It is still another object of the invention to provide a decoder capable of skipping calculation on the locations where no actual values are present without using any division circuit, so as to determine an error location with little delay time.

It is yet another object of the invention to provide a compact decoder-encoder circuit.

In accordance with an aspect of the invention, the degree of a polynomial is determined by a device consisting of arithmetic units, thus reducing the number of steps in the algorithm for determining the polynomial.

According to another aspect of the invention, the received word is stored in the memory, and the address of the memory is designated on the basis of the error location from the Chien search circuit to correct the received word at the address thereby eliminating the multi-stage shift register.

According to still another aspect of the invention, the coefficient registers of a Chien search circuit and the adders for the elements of a Galois field are combined in such a manner that no computation is carried out for the element of the Galois field corresponding to the error location that does not exist.

According to yet another aspect of the invention, the decoder and encoder share some hardware so as to provide a compact system.

Other objects, features, and advantages of the invention will be apparent from the following description taken in conjunction with the accompanying drawings.

DESCRIPTION OF THE PREFERRED EMBODIMENTS

Figure 1:
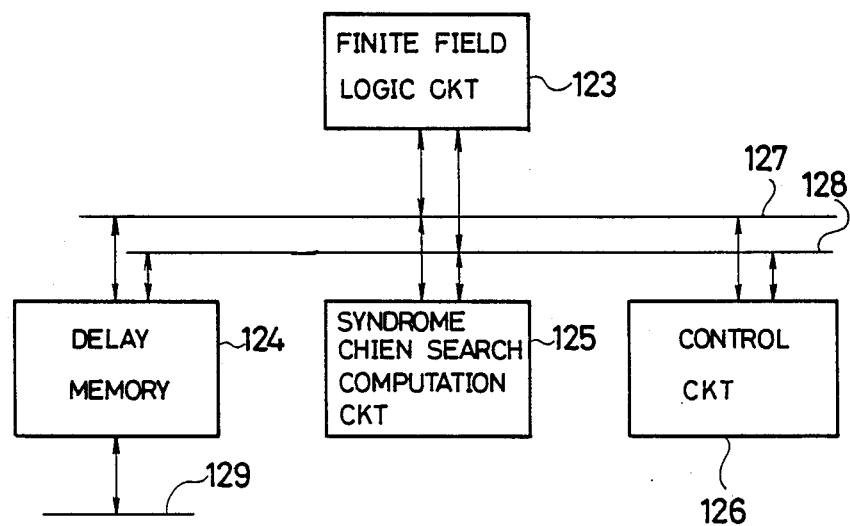
FIG. 1 is a block diagram of a decoder system embodying the present invention.

Referring now to FIG. 1 there is shown a decoder system according to the present invention. It consists of a finite field logic circuit 123 for calculating a finite field such as deriving an error locator or evaluator polynomial, a delay memory 124 for storing a receiving code word, a syndrome/Chien search computation circuit 125 for carrying out syndrome computation or Chien search operation, and a control circuit 126 for monitoring the finite field logic circuit 123, the syndrome/Chien search computation circuit 125 and the delay memory 124 to control them and adjust the transfer of data between them upon coding or decoding and store an error location address output from the syndrome/Chien search computation circuit.

Figure 2:
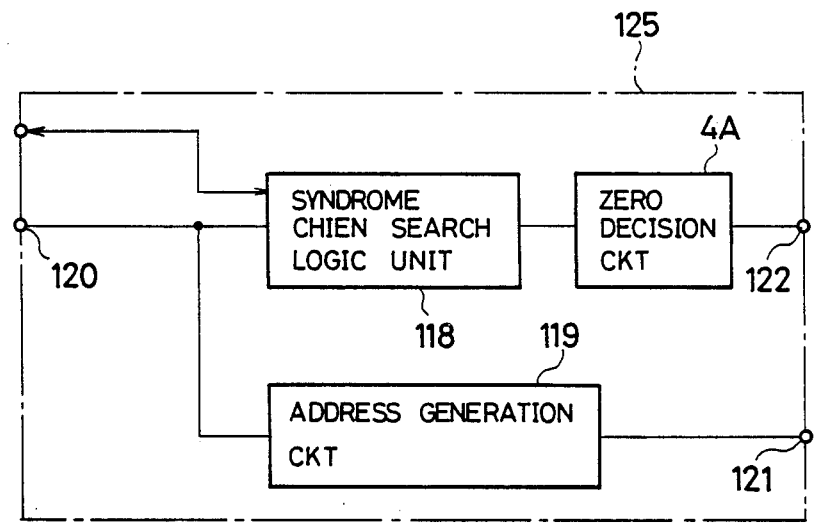
FIG. 2 is a block diagram of the syndrome Chien search computation circuit for the system of FIG. 1.

As FIG. 2 shows, the syndrome/Chien search computation circuit 125 consists of a syndrome/Chien search logic section 118 having the same function as that of the conventional circuit and an address generation circuit 119 operable in synchronism with the Chien search logic circuit 118. This address generation circuit 119 is arranged in the form of a subtraction-type counter circuit. The syndrome/Chien search circuit 125 also has a clock input terminal 120, an output terminal 121 of the address generation circuit 119, and an output 122 which indicates that the output at the terminal 121 has detected the root of an error locator polynomial. As FIG. 1 shows, the finite field logic circuit 123, the delay memory 124, and syndrome/Chien search logic circuit 125 are connected to data and control buses 127 and 128, respectively. A port of the memory 124 is connected to an external data bus 129 for input of a received coded word and output of the corrected word.

In operation, a received coded word is fed to the delay memory 124 through the external data bus 129. The coded word is then fed to the syndrome/Chien search computation circuit 125 to provide a syndrome, from which the finite field logic circuit 123 derives error locator and evaluator polynomials. The error locator polynomial is fed to the syndrome/Chien search logic section 118 for performing Chien search to feed the finite field logic circuit 123 with an address corresponding to a root of the error locator polynomial. The address generation circuit 119 for outputting the address operates as a subtraction counter in synchronism with the syndrome/Chien search logic circuit 118. The finite field logic circuit 123 calculates an error value from the Chien search result and corrects the content at the error location address of the delay memory 124 which has been received from the syndrome/Chien search computation circuit 125. The data and control signals in the above operation are transferred through the data bus 127 and control bus 128. Then, the corrected content is output on the external bus 129 through the memory 124.

As has been described above, the address generation circuit 119 operates in synchronism with the syndrome/Chien search circuit 118 to calculate an error location address in the memory 124, and the error correction code can be decoded through the finite field logic circuit 123 or delay memory 124 for storing the received coded word so that the multi-state shift register used in the conventional technology can be eliminated.

Although the above embodiment has been applied to the decoding of a non-binary coded word which requires the computation of an error value, the invention can be applied to the decoding of a binary coded word requiring no such computation. In this case, the content of the delay memory 124 may be inverted by using the address output from the syndrome/Chien search computation circuit 125.

Figure 3:
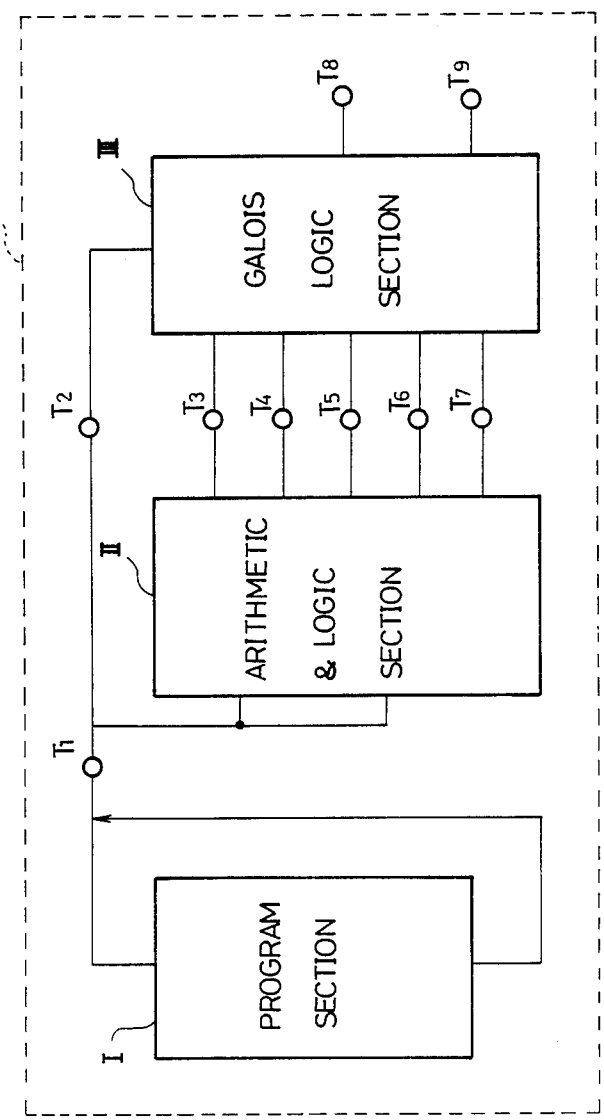
FIG. 3 is a block diagram of the finite field logic circuit for the system of FIG. 1.

Referring now to FIG. 3 there is shown a finite field logic CKT consisting of a program section I, an arithmetic and logic section II, and a Galois logic section III.

Figure 4:
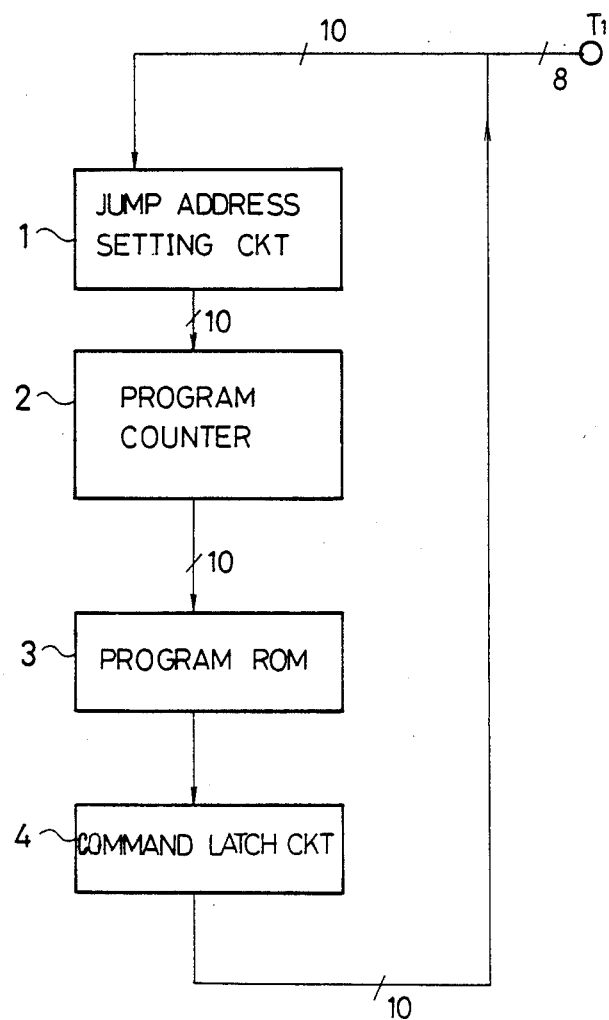
FIG. 4 is a block diagram of the program section of the finite field logic circuit of FIG. 3.

In FIG. 4, in the program section I, a jump address setting circuit 1 is provided to set an address to which an operation jumps. A program counter 2 has addresses from 0 through 1023 and enables either conditional or unconditional jump depending on the flag status. A program ROM 3 contains an execution control program. A latch circuit 4 stores commands.

Figure 5:
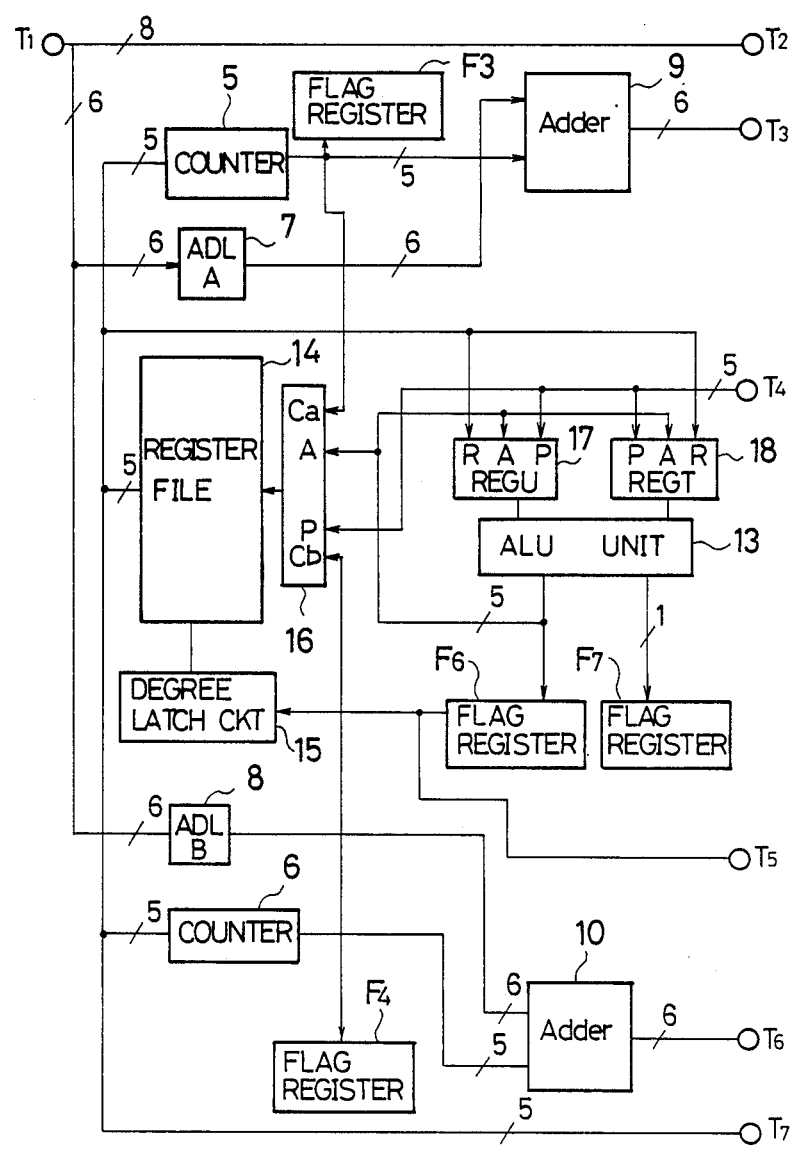
FIG. 5 is a block diagram of the arithmetic and logic section of the system of FIG.

As FIG. 5 shows, in the arithmetic logic section II, counters 5 and 6 are adapted to count up to 81 or down to 0. Address data latch circuits 7 and 8 are used for addresses of the index system, for example. Address adders 9 and 10 are of the 6-bit configuration, for example. The above jump setting circuit includes the start, reset, and control circuits of the decoder and permits conditional jump depending on the external or internal flag status.

Figure 6:
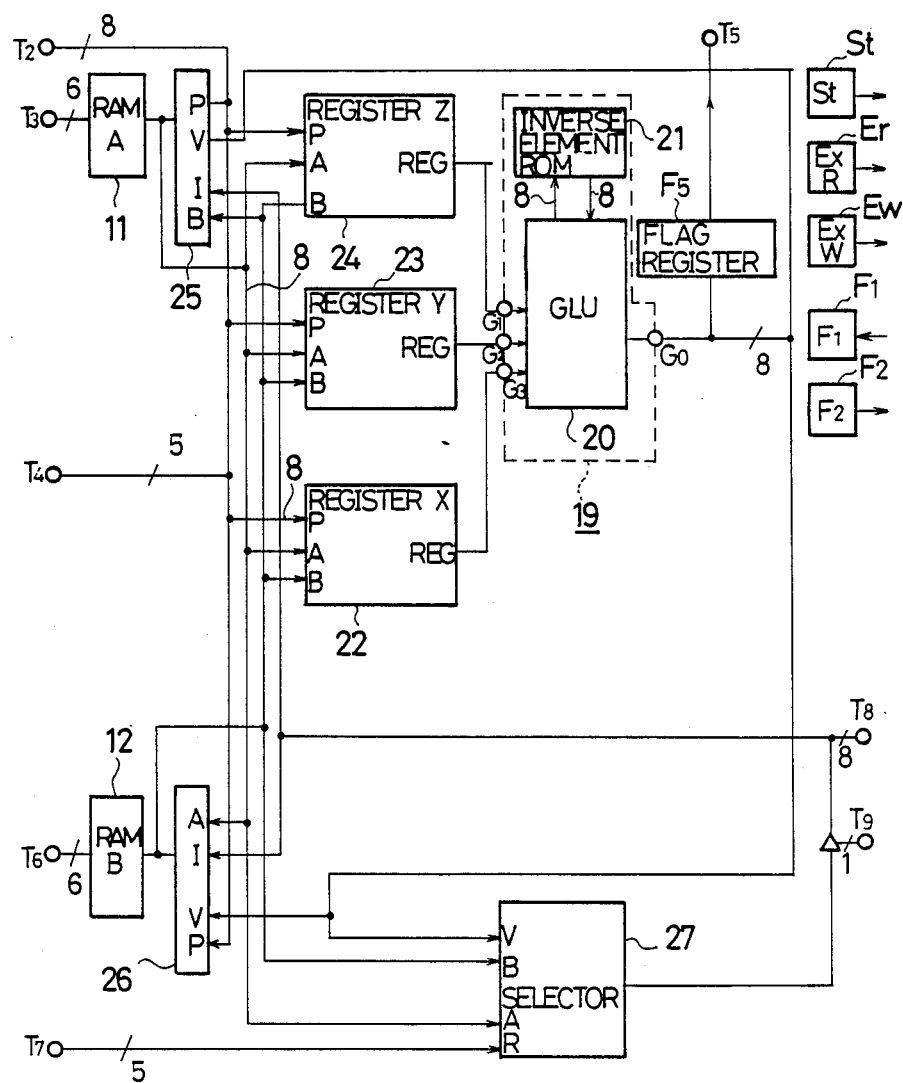
FIG. 6 is a block diagram of the Galois logic section of FIG. 3.

As FIG. 6 shows, in the Galois logic section III, flag registers F1 and F2 are used for generally input and output purposes, respectively. RAM A 11 and RAM B 12 are working random access memories. In FIG. 5 there is shown an arithmetic and logic unit (ALU) 13. A register file 14 has a capacity of 5 bits×4 words and four addresses AD1, AD2, AD3, and AD4, for example. A degree latch circuit 15 feeds the register file 14 with a write inhibit signal in response to a specified flag. A selector 16 is provided to select data lines (Ca, A, P, Cb). Registers 17 and 18 are provided to select and latch data lines (R, A, P) fed to the ALU 13. A stands for data for the ALU 13, P preset data, Ca a value of the counter 5, Cb a value of the counter 6, R a value of the register file 14. Flag registers F3 and F4 store the statuses of the counters, respectively.

In FIG. 6, a Galois logic unit (GLU) 19 has a logic processor 20 for performing operations $X+Z$, $X/Y$, $X \cdot Y + Z$, and $X^2 \cdot Y + Z$ in the Galois field. F5 is a status flag output from the GLU 19, and F6 and F7 are status flags output from the ALU 13. An inverse element ROM 21 is a ROM for division in the Galois field and has a capacity of 256 bytes in this embodiment. Registers 22, 23, and 24 are provided to select and latch data lines (P, A, B) to be fed to the GLU 19. P stands for preset data, and A and B are contacts for selecting data from RAM 11 and RAM 12, respectively. Selecters 25 and 26 have an input terminal I to which data is fed from the outside such as the syndrome or Chien search circuit and a terminal V to which the computation result of the GLU 19 is fed. A selector 27 is for data lines (V, A, B, R) output to the bus. St, Er, and Ew are flag registers for indicating whether or not the unit is under operation, there is a demand for reading from the bus, and there is a demand for outputting data to the bus, respectively.

Figure 7:
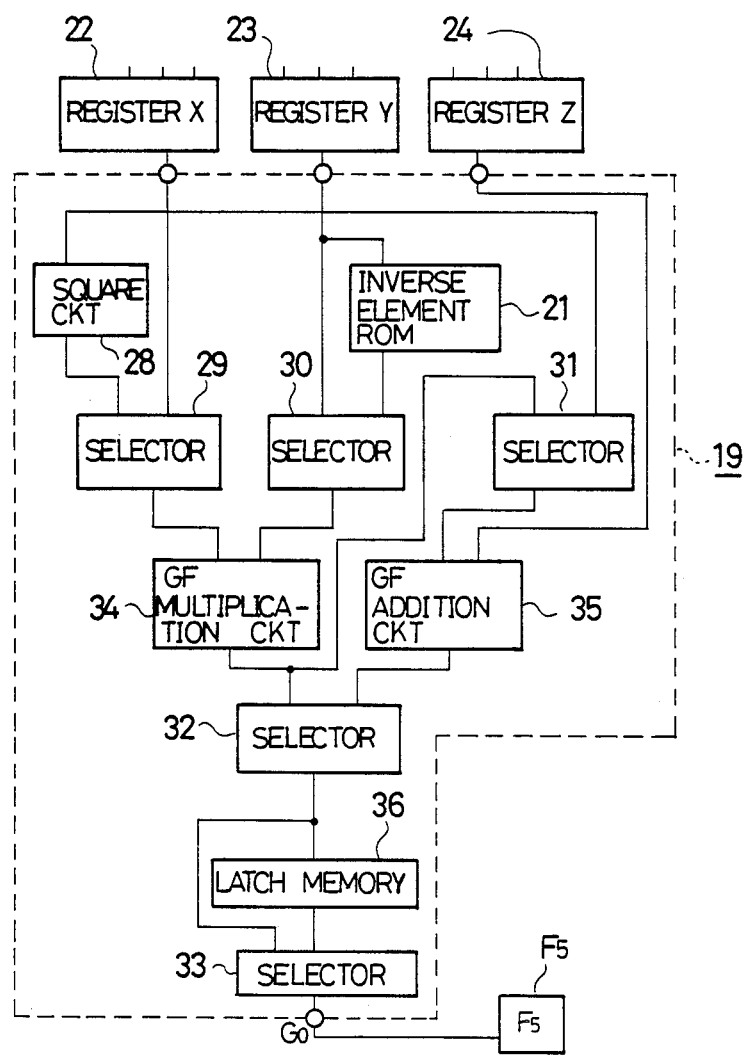
FIG. 7 is a block diagram of the Galois logic unit for use in the Galois logic section of FIG. 6.

In FIG. 7 there is shown the GLU 19 consisting of a square circuit 28, five selectors 29, 30, 31, 32, and 33, a multiplying circuit 34 in the Galois field, an adding circuit 35 in the Galois field, and a latch memory 36.

Figure 8:
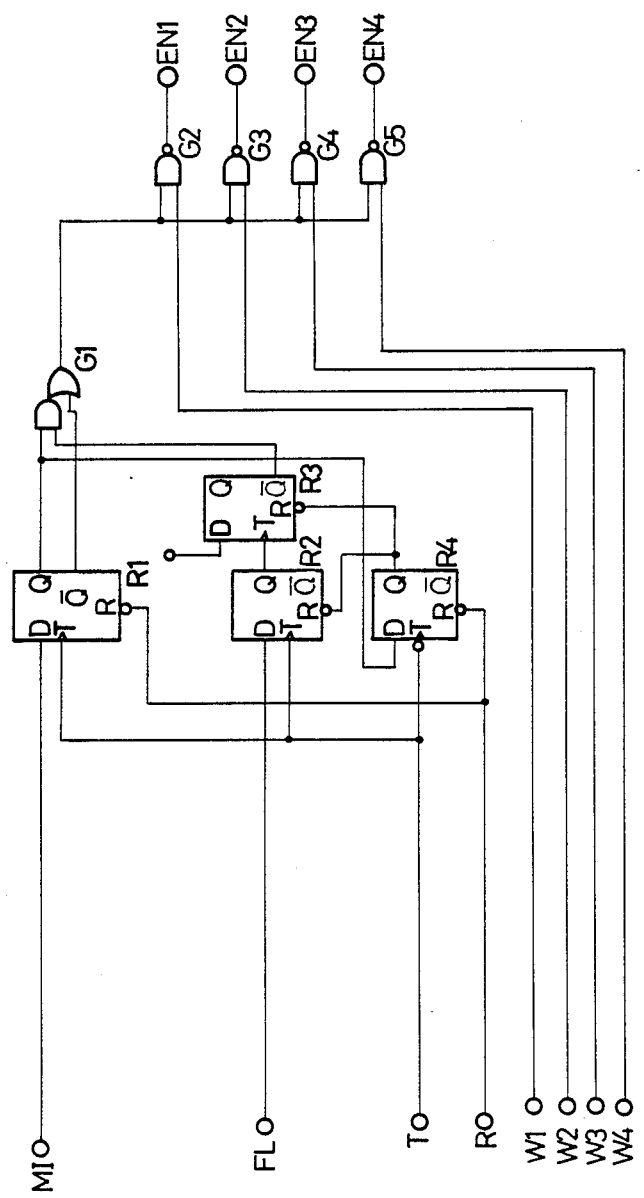
FIG. 8 is a logic circuit diagram of the degree latch circuit for use in the arithmetic and logic section of FIG. 5.

In FIG. 8 there is shown the degree latch circuit 15 consisting of a terminal MI to which a degree latch command is fed, four terminals W1, W2, W3, and W4 to which respective write commands at addresses AD1, AD2, AD3, and AD4 are fed, a flag signal input terminal FL, four terminals EN1, EN2, EN3, and EN4 to which respective write enable signals at addresses AD1, AD2, AD3, and AD4 are fed, four flip-flops R1, R2, R3, and R4, five gate circuits G1, G2, G3, G4, and G5, a clock input terminal T, and a reset signal input terminal R.

Figure 9:
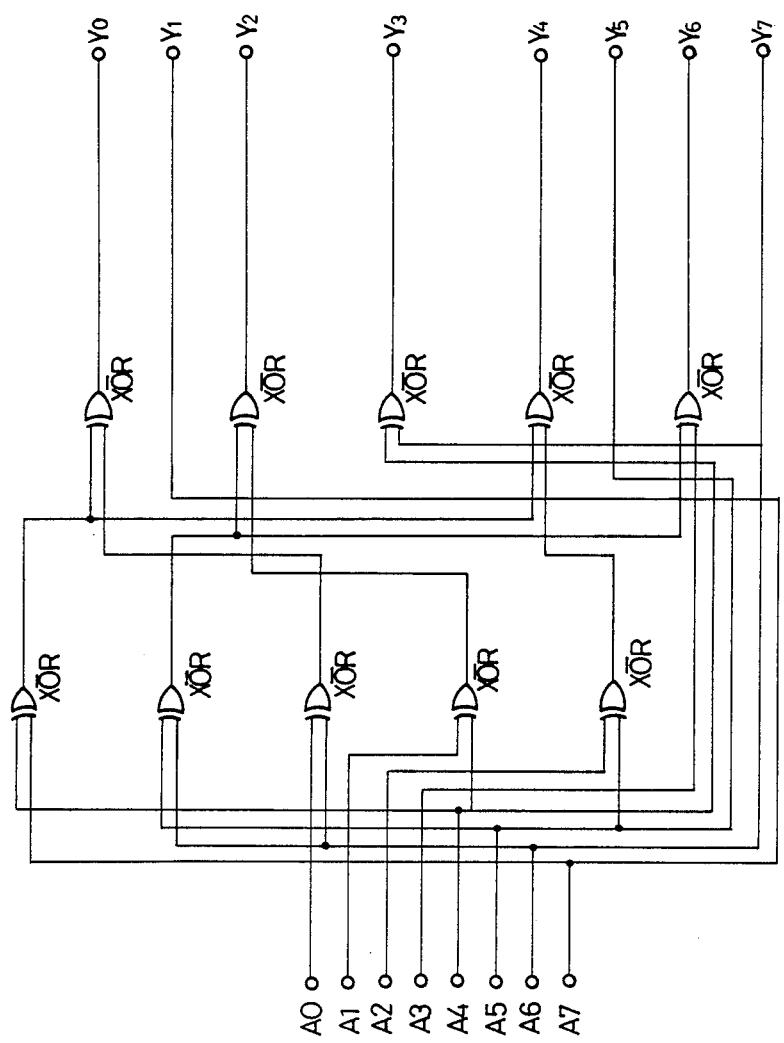
FIG. 9 is a logic circuit diagram of the square circuit of the Galois logic unit of FIG. 7.

In FIG. 9 there is shown the square circuit where an element X in the Galois field input at terminals A0, A1, ... A7 is squared and the value $X^2$ is output at terminals Y0, Y1, ... Y7. For example, when $\alpha^1$(01000000) is input and (00100000) is output, A0=0, A1=1, and A2=A3=... A7=0 are input, and Y0=Y1=0, Y2=1, and Y3=Y4=... Y7=0 are output. In FIGS. 4, 5, and 6, the number adjacent to / means the number of leads. For example, /6 indicates six parallel leads.

How the decoder determines an error location and value from a syndrome will be described with reference to the drawings.

Figure 13:
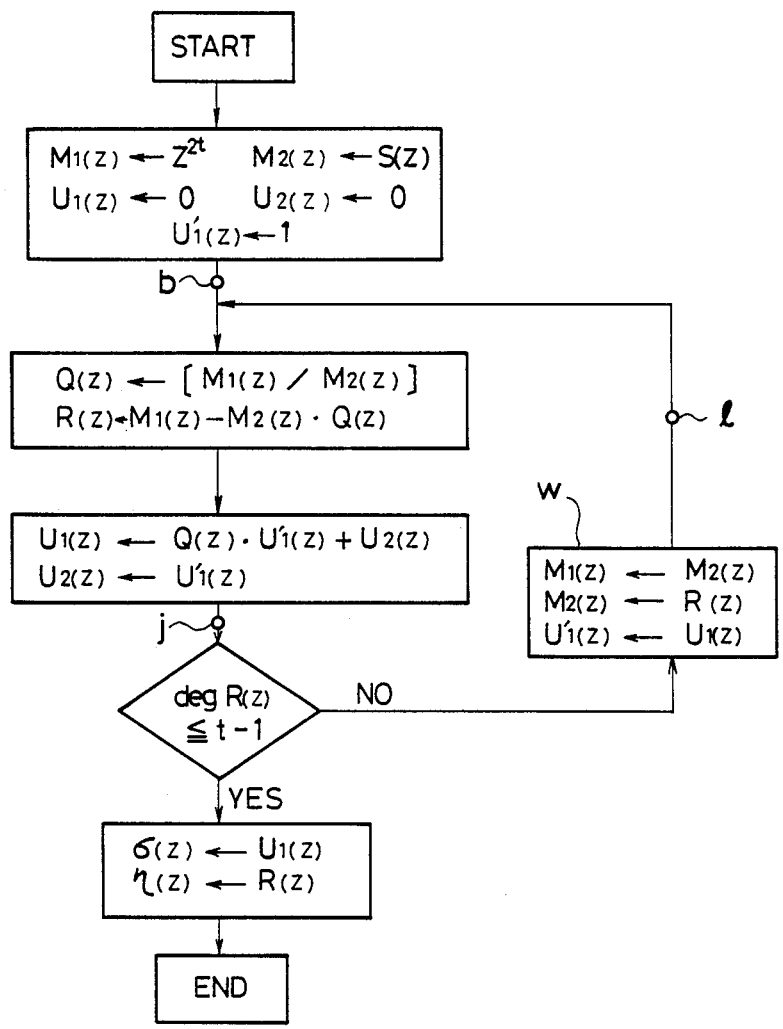
FIG. 13 is a flowchart showing the algorithm for determining an error location in the Chien circuit.
Figure 14:
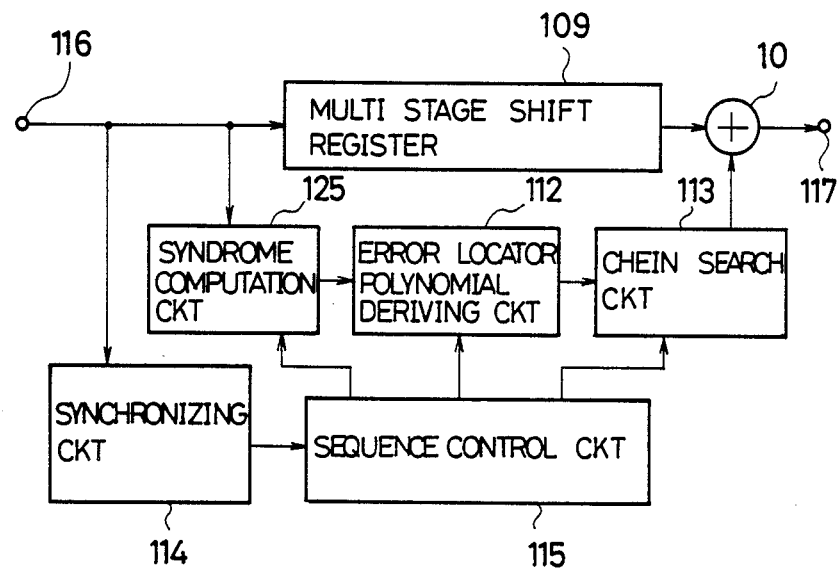
FIG. 14 is a block diagram of a conventional decoder.
Figure 15:
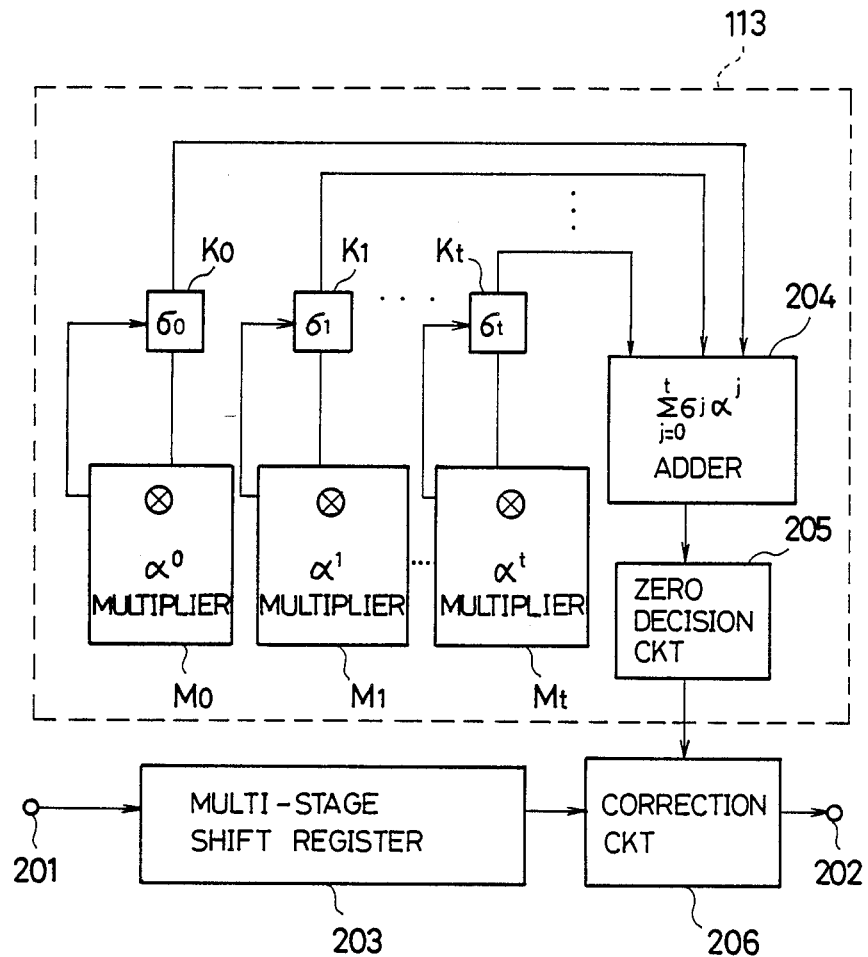
FIG. 15 is a block diagram of a conventional Chien circuit.

First, how the initial values up to point b of FIG. 13 are set will be described. The registers 17, 18, 22, 23, and 24, the register file 14, the counters, the RAM A 11, and RAM B 12 are cleared. The coefficient '01' of $M1(z)=z^{16}$ and the coefficient '01' of $U1'(z)=1$ are fed to the RAM A 11. The expression 'xx' means hexadecimal data. The counters 5 and 6, which indicate the RAM addresses for writing the above data, show the degrees of the respective polynomials. For example, the coefficient '01' of $M1(z)=z^{16}$ and the coefficient '01' of $U1'(z)=1$ are written at the addresses '10' and '00', respectively. The index registers ADLA 7 and ADLB 8 are used so that M2(z), U1'(z), M1(z), and U2(z) may not overlap. The highest degree '10' of $M1(z)=z^{16}$ is fed to AD2 of the register file 14.

The syndrome data S15, S14, ..., S1, S0 obtained from the syndrome computation are fed in sequence from the highest degree to the register 24 through the terminal 8 as coefficients of a syndrome polynomial $S(z)=S15z^{15}+S14z^{14}+...+S1z+S0$. The coefficients S15, S14, ..., S1, S0 latched in the register 24 are fed to the RAM A 11 as they are. At this point, if the GLU 19 finds that the coefficient of S(z) is not '00', it feeds '1' to the flag register F5. At the same time, it makes a choice through the selector 16 so that the data Ca of the counter 5 may be fed to AD1 of the register file 14. When the feeding of S(z) to the RAM A 11 is completed, the highest degree of S(z) is stored at AD1 of the register file 14 by means of the degree latch circuit 15 as described later. The data assignments in the RAMs 11 and 12 and the register file 14 when the inital setting is completed (at the point b of FIG. 13) are shown in the column a of FIG. 10.

The operation of the degree latch circuit, a feature of the invention, will be described. An example of the degree latch circuit is shown in FIG. 8. In this example, when the terminal MI is '1', the degree latch circuit operates. The signal '1' at the terminals W1, W2, W3, or W4 means a write command at AD1, AD2, AD3, or AD4 of the register file 14, and the signal '0' at the output terminal EN1, EN2, EN3, or EN4 makes AD1, AD2, AD3, or AD4 write enable. For example, if it is desired to latch the highest degree of S(z) at the address AD1 of the register file 14, the following procedure may be employed.

First, a signal '1' is fed to the terminal MI before the coefficients of S(z) are fed to the register 24. The flag input terminal FL is connected to the flag register F5 at the terminal T5 and has an output '0'. A signal '1' is fed to the terminal W1 for writing at AD1. The input '1' to the terminal MI is latched in the flip-flop R1 in timing with the clock T. If the output Q of the flip-flop R1 is '0' or its output QC is '1', the gate G1 outputs '1' unconditionaly so that the output terminal EN1 always outputs '0' when the input terminal W1 is '1', thus becoming write enable. The flip-flops R2 and R3 are kept under the reset condition.

On the other hand, when a signal '1' at the terminal MI is latched and the output Q of the flip-flop R1 is '1' or its output QC is '0', the condition QC of the flip-flop R3 is output at the gate G1. The flip-flops R2 and R3 are released from the reset condition a half the clock unit after Q of the flip-flop R1 becomes '1'. At this point, a signal '1' is output at QC of the flip-flop R3 so that the gate G1 outputs '1'. If the terminal W1 is '1', the output terminal EN1 outputs '0' becoming write enable.

Then, S(z) is fed to the GLU 19 and the flag register F5 becomes '1' when the first non-zero data is input.

When the terminal FL receives '1', the flip-flop R2 latches '1' at the time of rise of a clock pulse T. At the same time, the data of the counter 5 is latched at AD1 of the register file 14. The data then is the highest degree of S(z). Upon latching '1', the flip-flop R2 changes its Q from '0' to '1'. This signal change feeds '1' to the clock terminal of the flip-flop R3, which in turn changes its output QC to '0' and keeps it until a reset signal is fed to the flip-flop. This signal change to '0' at QC makes the gate G1 output '0'. This is a write inhibit command on the register file 14, thus turning the write enable terminals EN1, EN2, EN3, and EN4 to '1' regardless of the conditions of the write command input terminals W1, W2, W3, and W4. Consequently, no writing operation is carried out in the register file 14. This condition is maintained until the command on the degree latch circuit is released or the terminal MI receives '0' to permit the flip-flop R1 to latch '0', so that the highest degree of S(z) is stored at AD1 of the register file 14.

The operation of the loop portion which contains points j and l of FIG. 13 will be described. As best shown in FIG. 13, the division and sum of products of a polynomial in the Galois field are used. In the decoder of the invention, these operations are made in the GLU 19. A configuration of the GLU 19 is shown in FIG. 7. A square circuit 28 in the Galois field is composed of a group of gates so as to output $X^2$ when an element X in the Galois field is input. In $GF(2^8)$, for example, it is a logic circuit such as shown in FIG. 9. An inverse element ROM circuit 21 is designed to output $Y^{-1}$ when an element Y in the Galois field is input as an address. A multiplying circuit 34 in the Galois field is composed of a group of gates so as to output a product of the outputs from selectors 29 and 30. An addition circuit 35 in the Galois field is composed of a group of gates arranged in the form of an exclusive OR logic so as to output a sum of the outputs from the register 24 and the selector 29. With these logic circuits and selectors 29, 30, 31, and 32, various operations such as $X+Z$, $X/Y$, $X:Y+Z$, and $X^2:Y+Z$ can be made. The latch memory 36 and selector 33 also make a pipeline process possible.

First, the algorithm of division of a polynomial will be described. The registers X 22 and Y 23 are cleared. The coefficient of the highest degree of a polynomial M1(z) is fed to the register X 22 and the coefficients of a polynomial M2(z) is fed to the register Y 23 to perform a division X/Y. This output is the coefficient of the highest degree of a quotient polynomial Q(z). The highest degree of the quotient polynomial Q(z) can be obtained by feeding the register T 18 with the highest degree of M1(z) stored at AD2 of the register file 14 and the register U 17 with the highest degree of M2(z) stored at AD1 of the rester file to perform a subtraction $T-U$ in the ALU 13. This result is stored at AD4 of the register file 14.

Then, the coefficients of the above quotient polynomial Q(z) are latched in the register Y 23, and the coefficients of degrees lower than the highest degree of M2(z) are fed to the register X 22 in the order of degree and the coefficients of degrees lower than the highest degree of M1(z) are fed to the register Z 24 in the order of degree for performing a product and addition operation $X:Y+Z$ to find a remainder polynomial for the coefficients of Q(z). At this point, the degree latch circuit is operated to store the highest degree of the remainder polynomial at AD2 of the register file 14. The obtained polynomial is also overwritten on the RAM B 12 which stores M1(z). At this time, '00' is written at the address where the coefficient of the highest degree of M1(z) is stored.

Next, part of the operation for determining U1(z) by making use of the fact that the coefficient of the highest degree of the same Q(z) has been latched in the register Y 23 will be described. First, the degree data on the coefficients of Q(z) or data at AD4 of the register file 14 and the highest degree data of U1'(z) or data at AD3 of the register file 14 in the ALU 13 is added to determine the highest degree of the output polynomial. Then, the coefficient data of Q(z) latched in the register Y 23 are latched as they are, the coefficients of U1'(z) is fed to the register X 22 in sequence from the highest degree, and the coefficients of U2(z) are fed to the register Z 24 in sequence from the highest degree of the output polynomial to perform an operation $X:Y+Z$ in the GLU 19 and overwrite the output on the RAM B 12 where U2(z) has been stored.

The above operation is repeated until the 0th-degree coefficient of Q(z) is determined thereby providing R(z) and U1(z). Since the U1'(z) data remain in the RAM A 11, U2(z) can be determined without performing any computation. The data assignments in the RAM A 11 and RAM B 12, and the register file 14 upon completion of the first cycle of operation at the point j of FIG. 13 is shown in the column b of FIG. 10.

The operation below the point j of FIG. 13 will be described. In order to determine the degree of R(z), the degree data of R(z) or data at AD2 of the register file 14 is fed to the register U 17 and the constant $t-1$ is fed to the register T 18 to perform an operation $T-U$ in the ALU 13. In response to a mode command, the flag register F7 makes a true or false decision under any of conditions $T \geq U$, $T > U$, $T \leq U$, or $T < U$. In a case of true, it outputs '1'. Suppose here that a mode of $T \geq U$ is selected. Let us examine the flag register F7 with respect to the $T-U$ computation results. The flag register F7 is connected to the input of the jump address setting circuit 1 so that when the flag F7 is '1' in response to a conditional jump command, it jumps and leaves the repeatitive loop. If the flag F7 is '0' or $R(z) > t-1$, the afore-mentioned operation will be repeated after the operation W of FIG. 13. However, this requires only apparent change of the data assignments in the RAMs 11 and 12 and the register file 14. That is, in the second cycle of operation, the data output from the RAM A 11 in the first cycle of operation is output from the RAM B 12 and the data from the RAM B 12 is output from the RAM A 11. The data to the RAM A 11 is fed to the RAM B 12 and the data to the RAM B 12 is fed to the RAM A 11 to exchange the data assignments at AD1 and AD2 of the register file 14 without changing the operation. In this way, the operation speed is increased by providing two RAMs to eliminate the data transfer. The operation requiring at least three steps with the aid of a single RAM can be made in two steps by reading the input data from the first RAM and feeding the operational result to the second RAM to increase the operational speed.

Figure 10A:
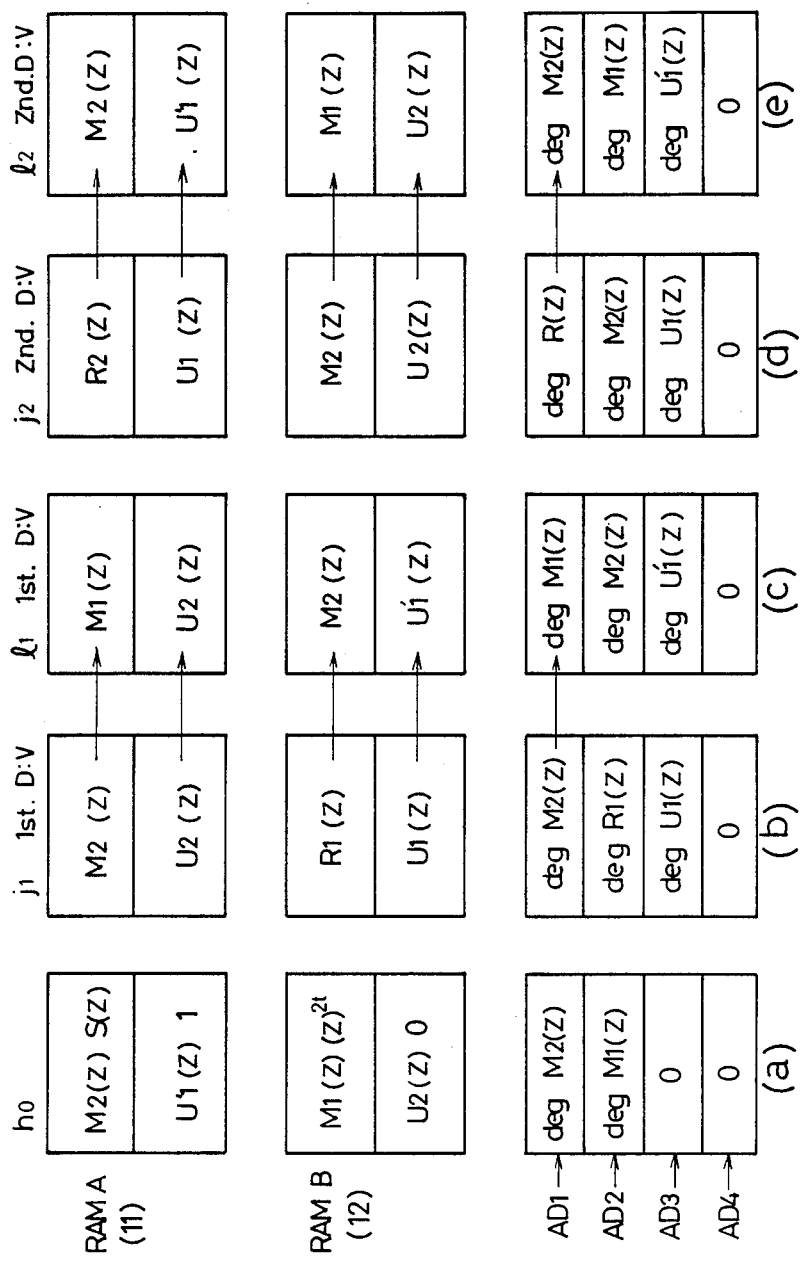
FIGS. 10(a) and (b) are charts showing the contents of RAM memories Ma and Mb and a register file to be updated according to the algorithm.
Figure 10B:
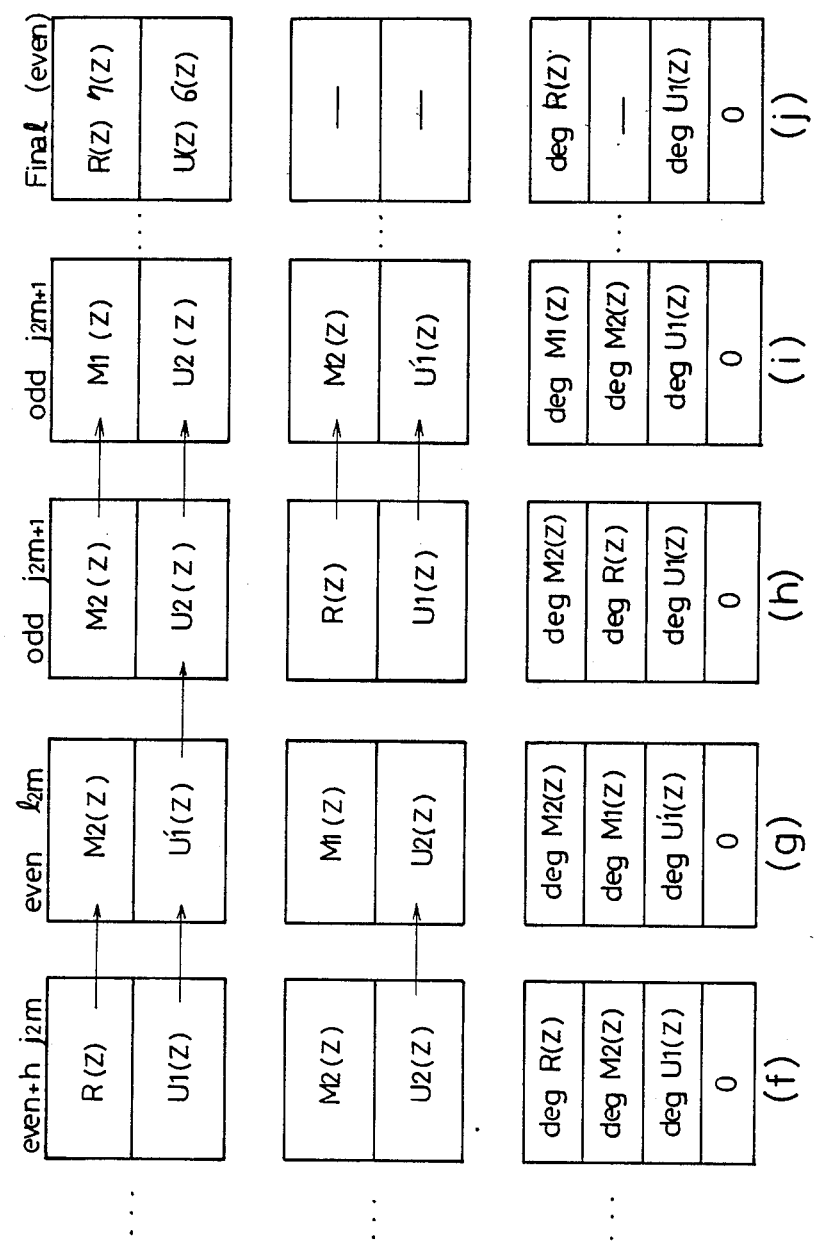

The respective data assignments in the RAMs A 11 and B 12 and the register file 14 in the second cycle at the points of j and l are shown in the columns d and e of FIG. 10, respectively. The data assignments at the points j and l in the even or odd numbers of cycles are shown in the columns f and g or h and i of FIG. 10, respectively. The data assignments when the highest degree of R(z) is below $t-1$ and the operation leaves the loop is shown in the column j of FIG. 10. In preparation for Chien search, $\eta(z)$ and $\sigma(z)$ are always stored in the RAM A 11.

Finally, the operation for correction from the error locator and evaluator polynomials $\sigma(z)$ and $\eta(z)$ will be described. First, the error location i and the element $\alpha_i$ indicating the location i in the Galois field are determined by performing a Chien search based on the obtained error locator polynomial $\sigma(z)$. The error value is determined from the obtained error locator polynomial $\sigma(z)$, error evaluator polynomial $\alpha(z)$, and the Galois element $\alpha i$. As shown in Eqs. 39 and 40, $$\sigma(z) = U1(z) = K\sigma0(z)$$

$$\eta(z) = R(z) = K\eta0(z)$$

where $\sigma0(z)$ and $\eta0(z)$ are equations with the highest-degree coefficient normalized to $\alpha^0$ (='01'). Let E be a set of error locations, then $$\sigma(z) = K \cdot \sigma o(z)$$
$$= K \prod_{j=E} (Z - a_j).$$

Hence, the Chien search has no influence on K. The derivative $\sigma'(z)$ of $\sigma(z)$ is determined by performing formal differentiation, and the error value ei is given by $$ei = \eta(\alpha i)/\sigma'(\alpha i).$$

Since $$ei = K\eta0(\alpha i)/K\sigma0'(\alpha i),$$

there is no effect on K. Thus, it is not necessary to normalize $\sigma(z)$ and $\eta(z)$ for determining the error location i and error value ei. The derivative $\sigma'(z)$ becomes a polynomial with the terms having degrees of only even numbers so that it can be computed at high speed by using the formula $X^2 \cdot Y + Z$ in the GLU 19. The error location i and error value ei thus obtained are used for correction of the error.

As has been described above, according to the invention, the determination of the degree of a polynomial, which requires many steps and much time to execute Euclid's algorithm, is speeded up by using the common arithmetic units, and the process is accelerated by means of a latch circuit for latching the degree data which are required for the execution of polynomial computation. Although the higest-degree coefficients of a locator polynomial $\sigma(z)$ and an evaluator polynomial $\eta(z)$ have been normalized to 1 ($=\alpha^0$) when Euclid's algorithm is completed, the error location i and the error pattern ei are determined in the middle of the operation to decrease the number of operational steps (or time). In addition, the conventional GLU can perform only a product X·Y, addition X+Y, or division X/Y at a step of operation, but, according to the invention, the operation X·Y+Z or $X^2 \cdot Y+Z$ in the Galois field can be carried out quickly in a single step by using a multiplying or squaring circuit which is able to execute in a single step. Since a pair of RAMs are provided in the GLU to increase the process speed, a decoder with a large minimum distance ($d \approx 10$–$30$) is possible.

The syndrome computation and Chien search operation in the syndrome/Chien search logic section 118 will be described with reference to FIG. 16. First of all, the registers L0 through L15 are cleared. The switch Sx is then turned on and the switches SW0 through SW15 are turned to the W side. The received data are successively fed to the input terminal 301. The input data each are added to the data produced by multiplying the output of each register Li (i=0 to 15) by $\alpha^i$ in the finite field multiplier Bi (i=1 to 15), where $\alpha$ is the element of a finite field, in each finite field adder circuit Ai (i=0 to 15). The output is latched in each register Li (i=0 to 15). The above is repeated from the received data rn−1 to r0 to give each register Li (i=0 to 15) the following data $$L0 = ri = S0$$
$$L1 = ri\,\alpha^i = S1$$
$$\ldots$$
$$Lj = ri\,\alpha^{ji} = Sj$$
$$L15 = ri\,\alpha^{15i} = S15.$$

These are the syndromes of the received data rn−1 through r0. Now, let Si (i=0 to 15) be the data of each register Li (i=0 to 15). When the syndromes S0 to S15 are determined, the repeating operation is terminated and the switches SW0 to SW15 are turned to the U side. The syndromes S15 to S0 are output in succession from the output terminal 303 by right shifting the registers L0 to L15.

The output syndromes are put into the finite field logic circuit 123 via the data bus 127 in FIG. 1, where an error locator polynomial $\sigma(z)$ and an error evaluator polynomial $\eta(z)$ are determined. The error locator polynomial $\eta(z)$, which is given by $$\sigma(z) = \sigma0 + \sigma1 z + \sigma2 z^2 + \ldots + \sigma t z^t,$$

is transformed to $$\overline{\sigma}(z) = \sigma t + \sigma t - 1z + \ldots + \sigma0 z^t$$

which is then output at the data bus 127 from the top degree.

Figure 11:
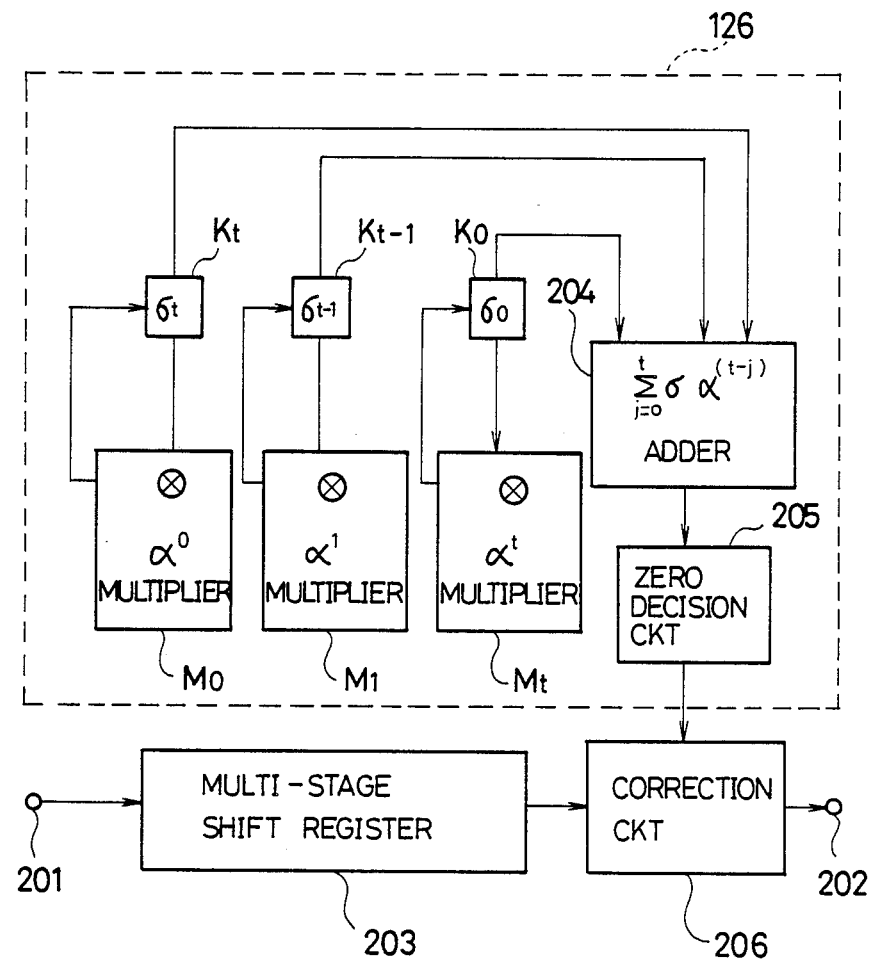
FIG. 11 is a detailed block diagram of the Chien search circuit of FIG. 1.

As FIG. 11 shows, this may be obtained by combining the coefficients of the error locator polynomial and the elements of the Galois field in such a manner that coefficients $\sigma t$, $\sigma t-1$, ..., $\sigma 0$ may correspond to the $\alpha^0$ multiplier, $\alpha^1$ multiplier, ..., $\alpha^t$ multiplier.

Let the code length n=148, the number of information symbols k=132, and the number of errors corrected t=8 at the minimum distance of 17, and the syndrome polynomial S(z) be $$S(Z) = \sum_{\mu j=0}^{15} S_j Z^j \qquad (48)$$

then, the error locator polynomial $$\sigma(Z) = \sigma_t Z^t + \sigma_{t-1} Z^{t-1} + \ldots + \sigma_0 \qquad (49)$$

$$= \sigma_t \prod_{i \in E} (Z - \alpha^{-i}) \qquad (50)$$

If there is an error at a location i, $\sigma(\alpha^{-i})$ in which the corresponding element $\alpha^{-i}$ in the Galois field is given by $$\sigma(\alpha^{-i}) = \sum_{j=0}^{t} \sigma_j \alpha^{-j \cdot i} = 0 \qquad (51)$$

Let $$\sigma_{j,i} = \sigma_{j\alpha - i \cdot j} \tag{52}$$

Then, $$\sigma_{j,254} = \sigma_{j\alpha - (255-1)j} = \sigma_{j\alpha j} \tag{53}$$

Hence, we obtain the following relation $$\sigma_{j,i-i} = \sigma_{j\alpha - (i-1)j} = \sigma_{j,i\alpha j} \tag{54}$$

In the Chien search circuit, Eq. 54 is recurrently calculated to output an error location corresponding $\alpha^{-i}$ at which the sum is zero. In this method, the form of a root of Eq. 50 is in the form of $\alpha^{-i}$ ($\alpha^{-i} = \alpha^{254-i}$), computation must be carried out for every location 254, 253, ..., 148. As Eq. 53 shows, computation is performed in the order from the location 255 to the location 0. However, there are no actual values in the locations 254 through 148 for shortened cyclic codes, and it is apparent there are no errors at these locations. Thus, Eq. 49 is transformed as follows $$\begin{aligned}\bar{\sigma}(Z) &= \sigma_0 Z^t + \sigma_1 Z^{t-1} + \ldots + \sigma_2 \\ &= \sigma_0 \underset{i_{EE}}{\pi} (Z - \alpha^i)\end{aligned} \tag{55}$$

If there is an error at a location i, $$\bar{\sigma}(\alpha^i) = \sum_{j=0}^{t} \sigma_{t-j} \alpha^{ij} = 0 \tag{56}$$

If we let $$\overline{\sigma_{j,i}} = \sigma_{t-j}\alpha^{ij} \tag{57}$$

then, $$\overline{\sigma_{j,1}} = \sigma_{t-j}\alpha^{(0+1)j} = \sigma_{t-j}\alpha^j \tag{58}$$

Hence, we obtain the following equation $$\overline{\sigma_{j,i+1}} = \sigma_{t-j}\alpha^{(i+1)j} = \sigma_{j,i}\alpha^j \tag{59}$$

which permits us to execute Chien search at high speed. As is apparent from Eq. 58, according to the invention, computation is performed from the location 0, thereby eliminating computation for the locations 148 through 254 where there are no actual values for shortened cyclic codes, thus reducing the delay time.

Figure 16:
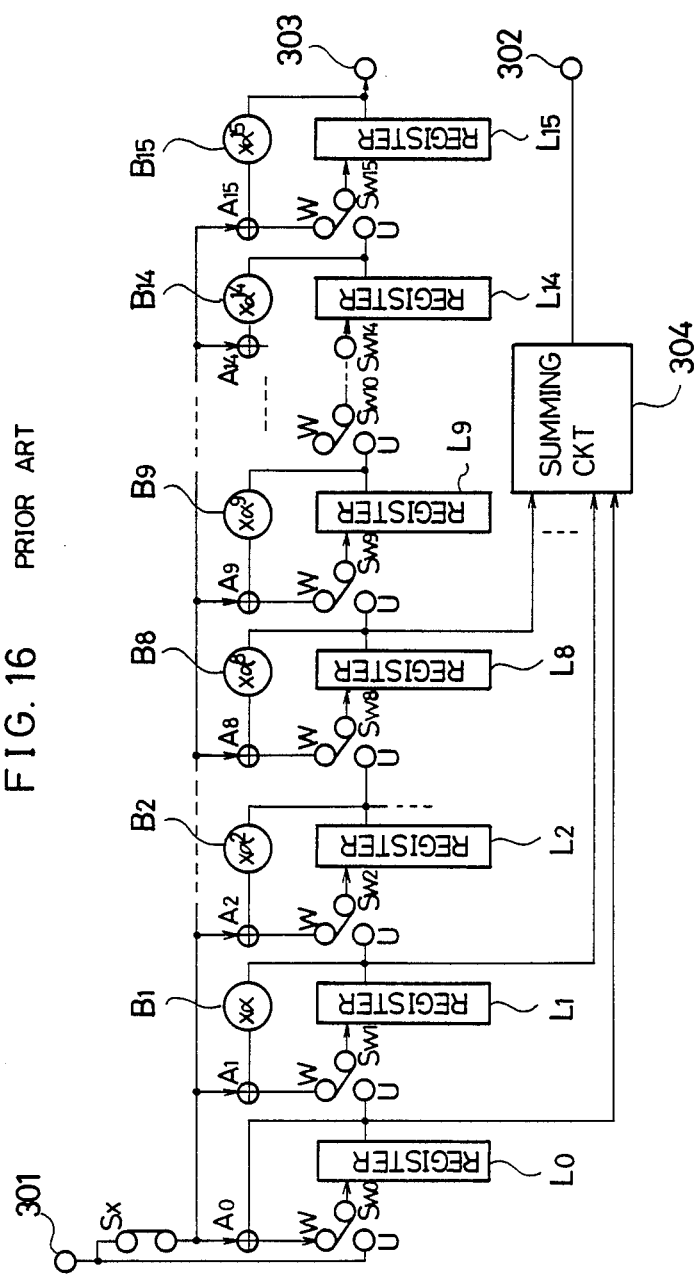
FIG. 16 shows a circuit used as both conventional syndrome computation and Chien search circuits.

When the Chien search is performed by using the circuit of FIG. 16, the registers L0 to L15 are cleared in advance. Also, the switch Sx is turned off and the switches SW0 to SW15 are turned to the U side. Then, the coefficients of $\bar{\sigma}(z)$ are fed to the input terminal 301 in succession from the top degree and the registers L0 to L15 are right shifted until $\sigma t$ is put into the register L0. At this point, the switches SW0 to SW15 are turned to the W side. The registers L0, L1, ..., Lt latch $\sigma t$, $\sigma t-1$, ..., $\sigma 0$, respectively. When the data input through the switch Sx are zero in the finite field adder circuits A0 to A15, the result is the same as shown in FIG. 11; i.e., the registers L0 to Lt in FIG. 16 correspond to K0 to Kt, respectively, in FIG. 11 and, similarly, the finite field multiplier Bi to Bt correspond to M1 to Mt, respectively. The $\alpha_0$ multiplier may be merely a line. The sum circuit 304 is equivalent to the $$\sum_{j=0}^{t}$$

adder. In this case, the adder is in the Galois field. The registers Lt+1 to L8 are connected to the input of the sum circuit 304 but they latch zero and have no influence on the Chien search. The outputs of the sum circuit 304 are put into the zero decision circuit 4A. In the case of all zeros, a flag is generated at the output terminal 122.

The address generator circuit 119 calculates the location address in the delay memory in synchronism with the Chien search. The flag signal and the location address are put into the control circuit 126 via the control data bus 128 in FIG. 1. When a flag is generated, the control circuit 126 stores the location address and, when the Chien search is completed, puts the element of a finite field corresponding to the error location into the finite field logic circuit 123 via the data bus 127.

Based on these data, the finite field logic circuit 123 determines the error value from the error locator polynomial $\sigma(z)$ and the error evaluator polynomial $\eta(z)$ for making correction. Thus, the decoder system of FIG. 1 completes decoding.

Figure 12:
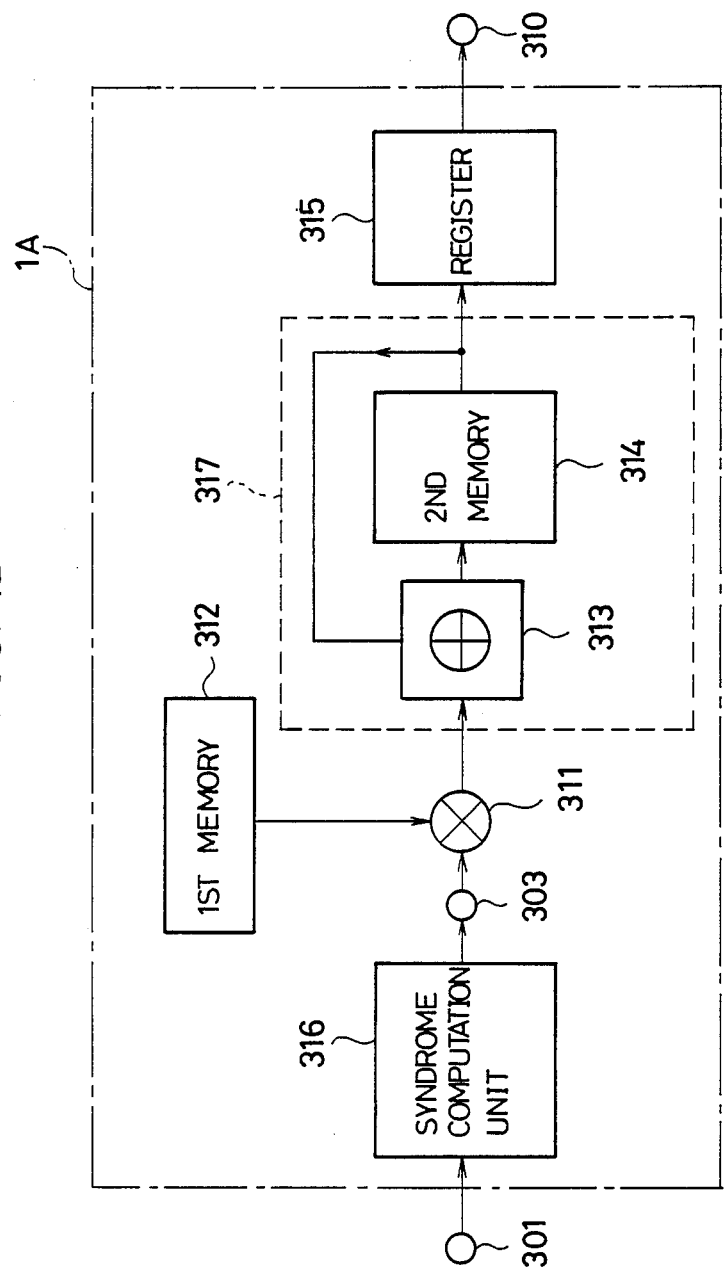
FIG. 12 is a block diagram of a circuit used as both syndrome computation circuit and check symbol computation circuit for coding.

On the other hand, encoding is carried out in the syndrome/Chien search computation circuit of FIG. 1; the syndrome/Chien search logic operation is carried out by the syndrome/Chien search computation circuit 125 of FIG. 1. The rest of the logic operation is performed by the finite field logic circuit 123. More specifically, the syndromes output from the syndrome/Chien search computation circuit 125 are put into the finite field logic circuit 123. The input syndromes are stored in the RAM A 11 of FIG. 6. This is comparable to the fact that the syndromes are stored in the syndrome computation section 316 of FIG. 12. The data which have been stored in the first memory of FIG. 12, are put into the register Y 23 in succession. The syndrome data in the RAM A 11 are put into the register X 22, and the RAM B 12 is assigned in place of the second memory 314 of FIG. 12. These data are put into the register Z 24 to perform a finite field logic X·Y+Z in the GLU 20. The results are fed back to the RAM B 12 to determine the check symbol data in the same manner as in the circuit of FIG. 12.

The principle of operation in these circuits will be described. The syndrome vector S of a received word vector r at the input terminal 301 is given by $$S = rH^T \tag{61}$$

where H is a parity check matrix and T is its transposed matrix. The received word vector r is given by $$\begin{aligned}r &= [r_i : r_c] \\ r &= [r_i : 0_c] + [0_i : r_c]\end{aligned} \tag{62}$$

where $r_i$ is the information symbol section, $r_c$ is the check symbol section, and $0_c$ and $0_i$ are zero symbols. The symbol [X:Y] means a concatenation Y after X. If there is no error, the syndrome vector S is given by $$S = rH^T = 0 \tag{63}$$

so that the encoding is equivalent to the computation of a vector which satisfies Eq. 63. That is, from Eqs. 62 and 63, $$\begin{aligned} r H^T &= ([\ r_i 0_c] + [\ 0_i\ r_c])\ H^T \\ &= [\ r_i 0_c]\ H^T + [\ 0_i\ r_c]\ H^T \\ &= S_i + [\ 0_i\ r_c]\ H^T = 0 \end{aligned} \quad (64)$$

$$\therefore S_i = [\ 0_i\ r_c]\ H^T \quad (65)$$

Since H is given by the following equation (66)

$$H = \begin{bmatrix} \alpha^0 & \cdots & \alpha^0 \\ \alpha^{n-1} & & \alpha^0 \\ \cdot & & \cdot \\ \cdot & & \cdot \\ \cdot & & \cdot \\ (\alpha^{d-2})^{n-1} & \cdots & \alpha^0 \end{bmatrix} \quad (66)$$

if the received vector is [0i:rc], the imaginary syndrome i is given by $$\begin{aligned} S_i &= [\ 0_i\ r_c]\ H^T \\ &= r_c \begin{bmatrix} \alpha^0 & \cdots & \alpha^0 \\ (\alpha^{d-z}) & & \alpha^0 \\ \cdot & & \cdot \\ \cdot & & \cdot \\ (\alpha^{d-z})^{d-z} & \cdots & \alpha^0 \end{bmatrix} \end{aligned} \quad (67)$$

Hence, rc is given by $$c = A^{-1} S_i \quad (68)$$

where $$A^{-1} = \begin{bmatrix} [\alpha^0 & \cdots & \alpha^0 \ ]^{-1} \\ (\alpha^{d-z}) & & \alpha^0 \\ \cdot & & \cdot \\ \cdot & & \cdot \\ (\alpha^{d-z})^{d-z} & \cdots & \alpha^0 \end{bmatrix}$$

The circuit of FIG. 12 is arranged so as to calculate Eq. 68. In response to the input information, the syndrome computation section 316 calculates an imaginary syndrome $S_i$. The elements $\alpha^0$ of $A^{-1}$ stored in the first memory 312 are read in sequence and multiplied with the syndrome $S_i$ in the multiplying circuit 311, and the product is fed to the adder 313.

The second memory 314, which has been cleared in the initial condition, cooperates with the adder 313 to calculate respective terms of $A^{-1}$ and i to give an accumlative sum for each term. Finally, the register 315 latches a check symbol c, which is then output at the terminal 310.

While a preferred embodiment of the invention has been described using specific terms, such description is for illustrative purpose only, and it is to be understood that changes and variations may be made without departing from the spirit and scope of the invention as defined in the following claims.

What is claimed is:

1. An error correction encoder/decoder system comprising:
    a memory for storing a received coded word;
    a finite field logic circuit for deriving an error locator polynomial and an error evaluator polynomial from said received word, said finite field logic circuit including;
    arithmetic and logic means for determining degrees of both of said polynomials, said arithmetic and logic means having a memory for storing intermediate data in calculating both of said polynomials;
    Galois logic means responsive to said degrees to solve both of said polynomials for making correction of an error; and
    program means for controlling said Galois logic means and said arithmetic and logic means;
    a syndrome/Chien search computation circuit for determining a syndrome and an error location from the results output from said finite field logic circuit; and
    an address generation circuit arranged in a form of subtraction type counter circuit and responsive to said error location to generate an address in said memory so that the received word at said address may be fetched and corrected.

2. An error correction encoder/decoder system according to claim 1, wherein said Galois logic means has three logic registers and two general purpose memories.

3. An error correction encoder/decoder system according to claim 1, wherein said Galois logic means determines an error location $\alpha_i$ and an error pattern ei without normalizing said locator polynomial $\sigma(z) = K.\sigma 0(z)$ and said evaluator polynomial $\eta(z) = K.\eta 0(z)$.

4. An error correction encoder/decoder system according to claim 1, wherein said Galois logic means has a square circuit in a Galois field.

5. An error correction encoder/decoder system according to claim 1, wherein said arithmetic and logic means with memory having a degree latch circuit for inhibiting any writing on said memory when a predetermined flag is established in a predetermined interval.

6. An error correction encoder/decoder system according to claim 1, wherein said memory of said arithmetic and logic means has a degree latch circuit for inhibiting any writing on said memory when a predetermined flag is established in a predetermined interval.

7. An error correction encoder/decoder system according to claim 1, wherein said Galois logic means has a first general purpose memory and a second general purpose memory, and said arithmetic and logic means has a memory for storing the degree of a polynomial; said first and second general purpose memories being arranged so that the data input from said first general purpose memory may be input from said second general purpose memory in the next operation, and the data input from said second general purpose memory may be input from said first general purpose memory in the next operation and that said memory of said arithmetic and logic means may exchange the data assignments between a first address and a second address for operation without any data transfer.

8. An error correction encoder/decoder system according to claim 1, wherein said syndrome/Chien search computation circuit for determining an error location from both of said polynomials comprises:

an adder for calculating $$\sum_{j=0}^{t} \sigma_j \alpha^{i(t-1)}$$

for said error locator polynomial $$\sigma(z) = \sum_{j=0}^{t} \sigma_j z^j$$

where $\alpha$ is an element in the Galois field, i an error location, and t the number of errors corrected; and a decision circuit for deciding whether said equation $$\sum_{j=0}^{t} \sigma_j \alpha^{i(t-1)}$$

satisfies zero thereby to determine an element $\alpha$ which satisfies $\sigma(\alpha)=0$.

9. An error correction encoder/decoder system according to claim 1, wherein said syndrome/Chien search computation circuit comprises:

a first memory for storing predetermined canstants;

a multiplying circuit for multiplying a syndrome output from said syndrome computation means with constants read in succession from said first memory; and a summing circuit for summing in succession the multiplication results from said multiplying circuit to give the sum thereof so as to output a check symbol for the information input to said syndrome computation means.

* * * * *